US011088156B2

(12) United States Patent
Cai et al.

(10) Patent No.: US 11,088,156 B2
(45) Date of Patent: Aug. 10, 2021

(54) MEMORY CELLS WITH EXTENDED ERASE GATE, AND PROCESS OF FABRICATION

(71) Applicant: GLOBALFOUNDRIES Singapore Pte. Ltd., Singapore (SG)

(72) Inventors: Xinshu Cai, Singapore (SG); Shyue Seng Tan, Singapore (SG); Kiok Boone Elgin Quek, Singapore (SG); Eng Huat Toh, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 61 days.

(21) Appl. No.: 16/553,189

(22) Filed: Aug. 28, 2019

(65) Prior Publication Data
US 2021/0066324 A1    Mar. 4, 2021

(51) Int. Cl.
*H01L 29/76*    (2006.01)
*H01L 27/11524*  (2017.01)
*H01L 27/11519*  (2017.01)

(52) U.S. Cl.
CPC .. *H01L 27/11524* (2013.01); *H01L 27/11519* (2013.01)

(58) Field of Classification Search
CPC ......... H01L 27/11524; H01L 27/11519; H01L 27/11521; H01L 29/7851
See application file for complete search history.

(56) References Cited

U.S. PATENT DOCUMENTS

| 5,242,848 | A | 9/1993 | Yeh |
| 6,133,097 | A | 10/2000 | Hsieh et al. |
| 6,747,310 | B2 | 6/2004 | Fan et al. |
| 10,644,011 | B1* | 5/2020 | Fan ........................ H01L 29/788 |
| 2016/0240622 | A1* | 8/2016 | Fan ..................... H01L 29/42328 |
| 2018/0315764 | A1* | 11/2018 | Yang ................. H01L 29/40114 |

* cited by examiner

*Primary Examiner* — Phuc T Dang
(74) *Attorney, Agent, or Firm* — David Cain

(57) ABSTRACT

A flash memory device is provided. The device comprises a substrate and a source region in the substrate. A first gate stack is positioned above the substrate and adjacent to the source region. A dual function gate structure having an upper portion and a lower portion is positioned above the source region. The upper portion of the dual function gate structure overlaps the first gate stack and the lower portion is adjacent to the first gate stack. A second gate is positioned above the substrate on an opposite side of the first gate stack from the dual function gate. A drain region is in the substrate adjacent to the second gate.

20 Claims, 6 Drawing Sheets

MEMORY CELLS WITH EXTENDED ERASE GATE, AND PROCESS OF FABRICATION

FIELD OF THE INVENTION

The disclosed embodiments relate generally to semiconductor memory devices, and more particularly, to a nonvolatile memory with improved reliability and higher integration density and the manufacture thereof.

BACKGROUND

A nonvolatile memory device retains stored data even if power is turned off. Nonvolatile memory is currently available in several forms, including electrically programmable read only memory (EPROM), electrically erasable programmable read only memory (EEPROM), and flash EEPROM.

Current flash memory architecture utilizes a floating gate, a control gate, a select gate and an erase gate, all of which are made of polysilicon. The control gate is stacked above the floating gate and the select gate is adjacent to these stacked gates. An erase gate is positioned on an opposite side of these stacked gates from the select gate. A source region is positioned below the erase gate. A drain region is adjacent to the select gate.

A bias is applied to the select gate of a memory device to turn on the device for program, erase or reading operations. The control gate is used to program the memory device, resulting in storage of electrons in the floating gate. The erase gate is used to expel the stored electrons from the floating gate, thus erasing the device.

As four separate polysilicon gates are used for programming and erasing operations, the cell size is relatively large. In addition, the fabrication of four separate polysilicon gates is complicated and costly as it requires multiple polysilicon deposition processes and planarization processes. Thus, there is an urgent need for an improved flash memory device structure to overcome the challenges mentioned above.

SUMMARY

In an aspect of the present disclosure, a memory device is provided. The device comprises a substrate and a source region in the substrate. A first gate stack is positioned above the substrate and adjacent to the source region. A dual function gate structure having an upper portion and a lower portion is positioned above the source region. The upper portion of the dual function gate structure overlaps the first gate stack and the lower portion is adjacent to the first gate stack. A second gate is positioned above the substrate on an opposite side of the first gate stack from the dual function gate. A drain region in the substrate is adjacent to the second gate.

In another aspect of the present disclosure, a memory device array is provided. The array comprises a substrate and a source region in the substrate. Floating gate stacks are positioned above the substrate and adjacent to opposite sides of the source region. An erase/control gate having an upper portion and a lower portion is positioned above the source region. The upper portion of the erase/control gate overlaps the floating gate stacks and the lower portion is adjacent to the floating gate stacks. Select gates are positioned above the substrate on opposite sides of the floating gate stacks from the erase/control gate. Drain regions in the substrate are adjacent to the select gates.

In yet another aspect of the present disclosure, a method of fabricating a memory device array is provided. The method comprises providing a substrate and forming floating gate stacks above the substrate. A source region is formed between the floating gate stacks. A dual function gate having an upper portion and a lower portion is formed above the source region. The upper portion of the dual function gate overlaps the floating gate stacks and the lower portion is adjacent to the floating gate stacks. Select gates are formed on opposite sides of the floating gate stacks from the dual function gate. Drain regions are formed adjacent to the select gates.

Numerous advantages may be derived from the embodiments described below. The erase/control gate may be used in both erasing and programming operations. Hence, only three different polysilicon gates are used for device operations, namely the floating gate, the select gate and the erase/control gate. Thus, the device size is minimized. For example, the device size may be reduced by up to 47% as compared to prior art. In addition, as the number of polysilicon gates in the memory device is reduced, the fabrication steps are simplified and less time consuming. For example, the number of polysilicon depositions and planarization are reduced as compared to prior art.

Moreover, the amount of overlap between the erase/control gate and the floating gate stack may be tuned to increase erase/control gate to floating gate coupling ratio and improve both the program and erase performances. The term "coupling ratio" is used to indicate voltage transfer capability from the erase/control gate to the floating gate stack.

BRIEF DESCRIPTION OF THE DRAWINGS

The disclosed embodiments will be better understood from a reading of the following detailed description, taken in conjunction with the accompanying drawings.

Figure 1A:
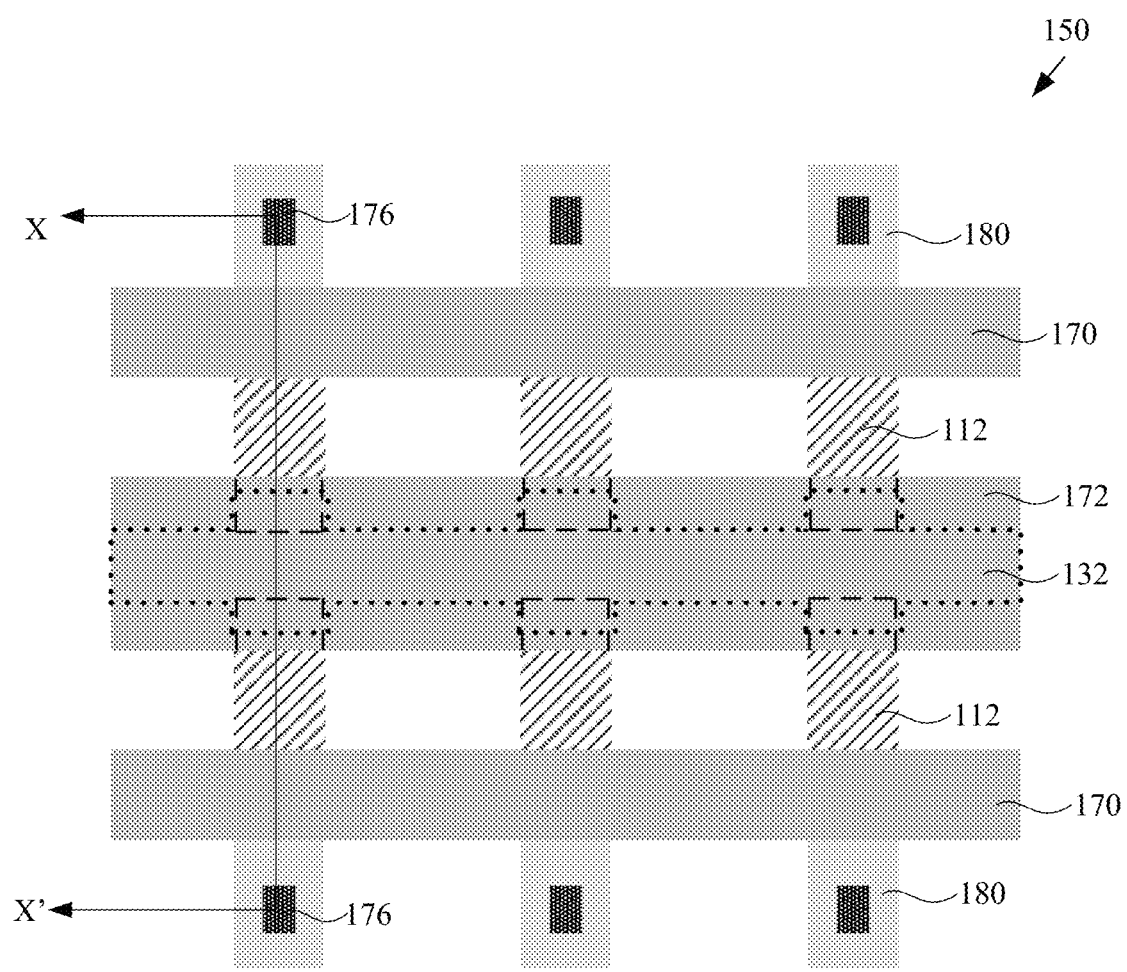
FIG. 1A is a top view of a memory device array according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

FIG. 1A is a top view of a memory device array 150 according to an embodiment of the disclosure. In this embodiment, the memory device array 150 may be a flash memory device array. Referring to FIG. 1A, floating gates 112 are positioned on opposite sides of a dual function gate 172. In an embodiment, the dual function gate may be an erase/control gate 172, i.e., acting as an erase gate and a control gate. The erase/control gate 172 partially overlaps the floating gates 112. Portions of the floating gates 112 underneath the erase/control gate 172 are shown as dashed outlines. A source region 132, shown as a dotted outline, is positioned under the erase/control gate 172. The floating gates 112 may overlap with the source region 132. Select gates 170 are positioned on opposite sides of the floating gates 112 from the erase/control gate 172. In an embodiment, a select gate 170 may be a section of a word line. Drain regions 180 are positioned adjacent to the select gates 170 together with bit line contacts 176. Also shown is a section line X-X' that is used to present further aspects of the disclosure in the following figures.

As the dual function gate may act as an erase gate and a control gate, the number of gates involved in device operations is reduced. Hence, the device area is minimized as compared to conventional flash memory device architecture. For example, the device area may be reduced by up to 47% as compared to prior art. In addition, the reduction in the number of gates leads to a simpler fabrication process flow. For example, the number of gate material deposition, e.g., polysilicon deposition and planarization processes are reduced.

Figure 1B:
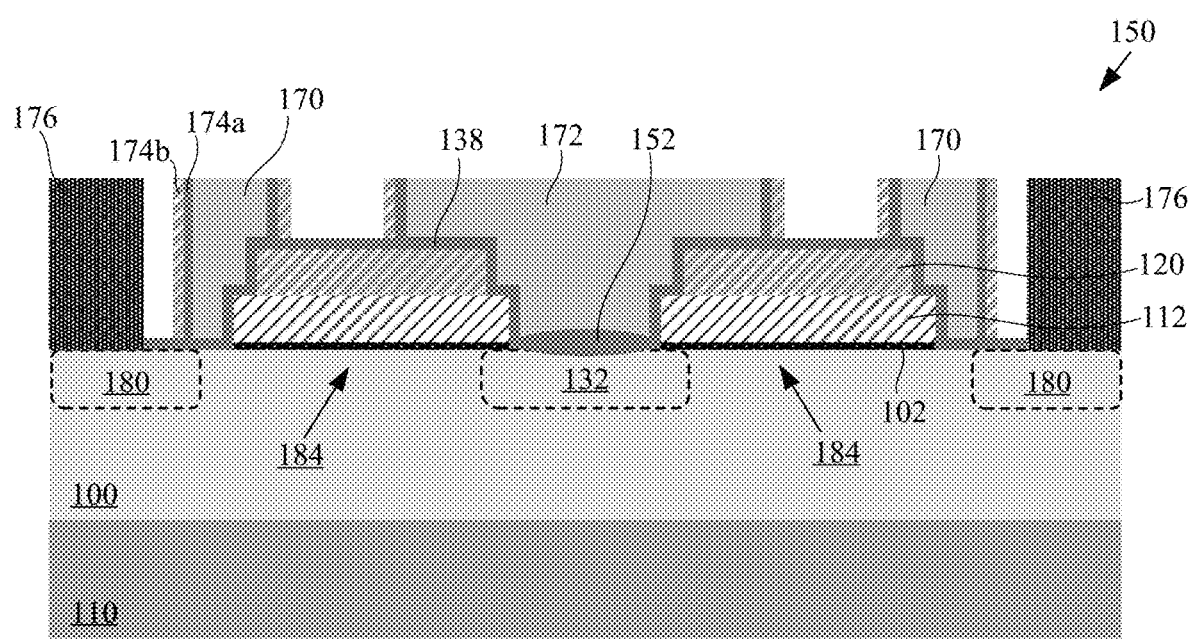
FIG. 1B is a cross-section view of a flash memory device array taken along section line X-X' of FIG. 1A, according to an embodiment of the disclosure.

FIG. 1B is a cross-section view of a flash memory device array 150 taken along section line X-X' of FIG. 1A. Referring to FIG. 1B, the flash memory device array 150 includes a substrate 110 and the source region 132 in the substrate 110. A doped well region 100 may also be formed in the substrate 110. Floating gate stacks are positioned above the substrate 110 and adjacent to opposite sides of the source region 132. In an embodiment, the floating gate stack may include a gate dielectric layer 102, a floating gate 112 and a dielectric cap 120. The gate dielectric layer 102 separates the floating gate 112 from the substrate 110. The erase/control gate 172 is positioned above the source region 132 and between the floating gate stacks. The erase/control gate 172 has an upper portion and a lower portion. The upper portion of the erase/control gate 172 overlaps the floating gate stacks and may function as a control gate. The lower portion of the erase/control gate is adjacent to the floating gate stacks and may function as an erase gate.

Figure 2:
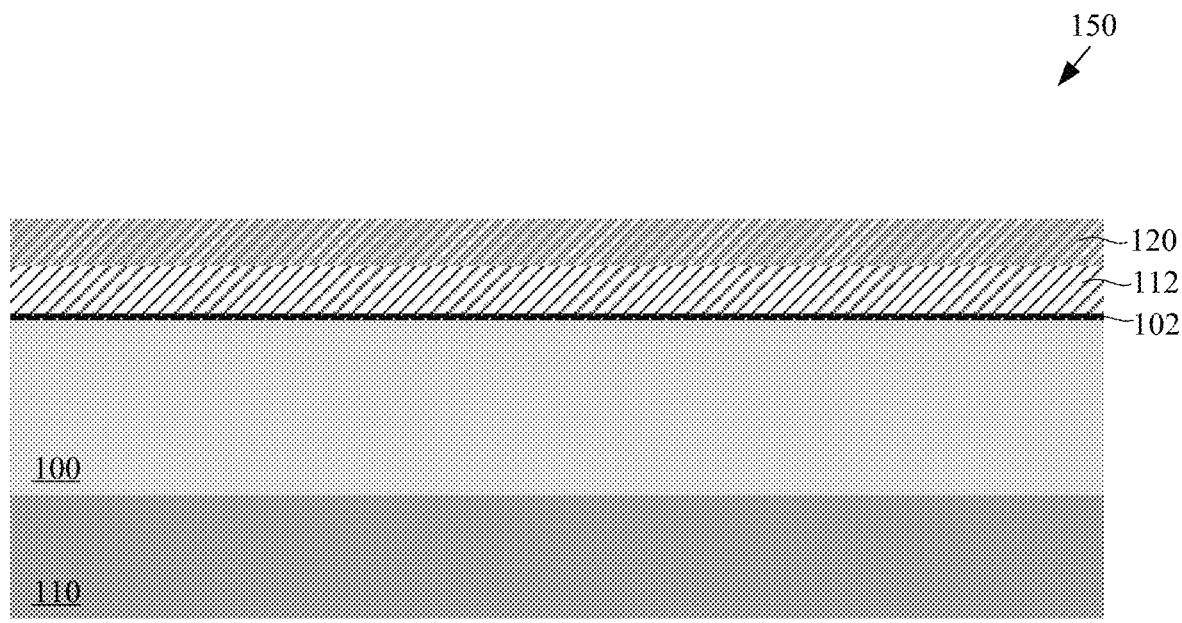
FIG. 2 is a cross-section view of a partially completed flash memory device array, according to an embodiment of the disclosure.

FIGS. 2 to 8 illustrate a fabrication process flow for a flash memory device array 150 according to the present disclosure. FIG. 2 is a cross-section view of a partially completed flash memory device array 150, according to an embodiment of the disclosure.

Referring to FIG. 2, a substrate 110 with a gate dielectric layer 102 over the substrate 110 is provided. In an embodiment, the gate dielectric layer 102 may be a tunnel oxide layer. The thickness of the tunnel oxide layer 102 ranges between 80 Å and 100 Å, and the preferred thickness is 90 Å. In an embodiment, the tunnel oxide layer 102 may be made of thermally grown silicon dioxide. The substrate 110 may be pre-patterned with strips of field oxide or shallow trench isolation (not shown) that are positioned parallel to drain regions (not shown). The substrate 110 may be in the form of a p-substrate. In an embodiment, the substrate 110 may be made of monocrystalline silicon.

Thereafter, a floating gate layer 112 may be deposited over the tunnel oxide layer 102. The floating gate layer 112 may be made of a conductive layer of polysilicon or amorphous silicon. The thickness of the floating gate layer 112 ranges between 300 Å and 600 Å, and the preferred thickness is 400 Å. The floating gate layer 112 may be patterned in a direction parallel to drain regions (not shown). In an embodiment, the floating gate layer 112 may be deposited by chemical vapor deposition (CVD), atomic layer deposition (ALD), physical vapor deposition (PVD) or any other suitable deposition methods.

A dielectric cap 120 may subsequently be deposited over the floating gate layer 112. The dielectric cap 120 may be made of silicon dioxide and silicon nitride (ON) film or a silicon dioxide-silicon nitride-silicon dioxide (ONO) film consisting of a bottom oxide layer having a thickness range between 50 Å and 100 Å, a central layer of nitride having a thickness range between 200 Å and 400 Å and a top oxide layer having a thickness range between 50 Å and 100 Å. In an embodiment, the dielectric cap 120 may be deposited by CVD, ALD, PVD or any other suitable deposition methods. A doped well region 100 may also be formed in the substrate 110 by implanting dopants such as boron nitride or $BN^+$ followed by activation anneal.

The floating gate layer 112 may be doped with phosphorus or arsenic to a level on the order of $10^{17}$ to $10^{20}$ $cm^{-3}$. This may be done either by in-situ doping during the deposition of the floating gate layer 112 or by ion implantation either directly into the floating gate layer 112 or through the dielectric cap 120.

Figure 3:
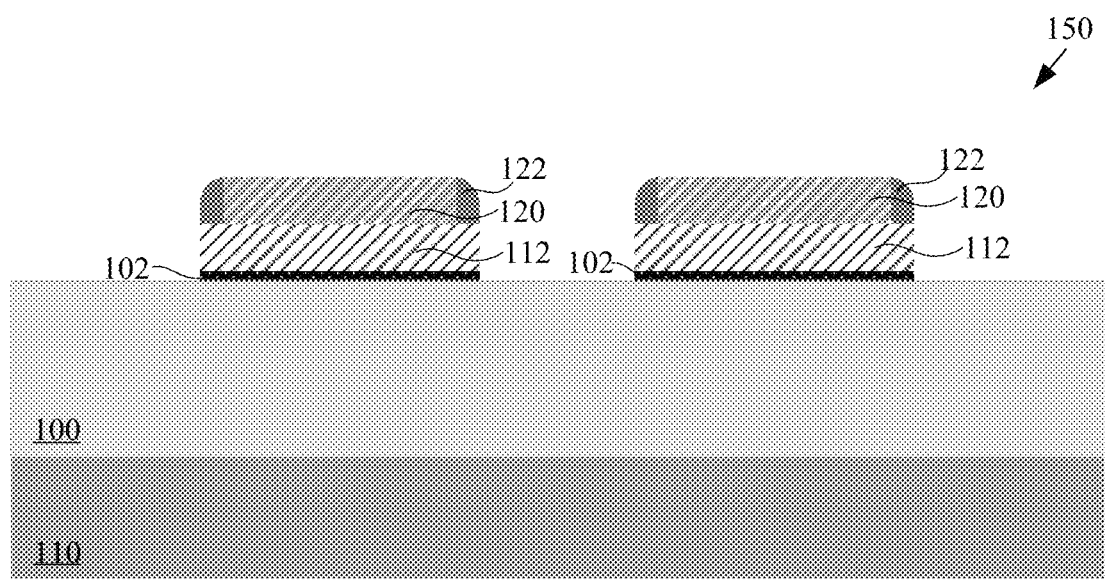
FIG. 3 is a cross-section view of a partially completed flash memory device array after patterning of dielectric caps, dielectric spacer formation on sidewalls of the dielectric caps and patterning of a floating gate layer, according to an embodiment of the disclosure.

FIG. 3 is a cross-section view of a partially completed flash memory device array 150 after patterning of the dielectric cap 120, formation of dielectric spacers 122 on sidewalls of the dielectric caps 120 and patterning of the floating gate layer 112, according to an embodiment of the disclosure. Referring to FIG. 3, the dielectric cap 120 is patterned in a photolithographic step. Although not shown, patterning of the dielectric cap 120 may include depositing a layer of photoresist material on the dielectric cap 120 followed by conventional photoresist exposure and developing to form photoresist patterns that are consistent with prior art practices. A wet etch or dry etch process may be used to remove portions of the dielectric cap 120 that are not covered by the photoresist patterns. Although not shown, the photoresist material is removed after the etching processes.

Dielectric spacers 122 may subsequently be formed on sidewalls of the dielectric caps 120. The formation of dielectric spacers 122 may include depositing a layer of silicon dioxide over the dielectric caps 120 and the floating gate layer 112 and anisotropically etching the silicon dioxide layer to form dielectric spacers 122. The silicon dioxide layer may be deposited by CVD, ALD, PVD or any other suitable deposition methods. The anisotropic etching may be a dry etch process. The floating gate layer 112 and the tunnel oxide layer 102 may subsequently be patterned using the dielectric caps 120 with the dielectric spacers 122 as a mask layer. The patterning may be by a wet etch or dry etch processes to form floating gate stacks. The dielectric spacers 122 may subsequently be removed from the sidewalls of the dielectric caps 120.

The term "anisotropic etching" refers to etching which does not proceed in all directions at the same rate. If etching proceeds exclusively in one direction (e.g., only vertically), the etching process is said to be completely anisotropic.

Figure 4:
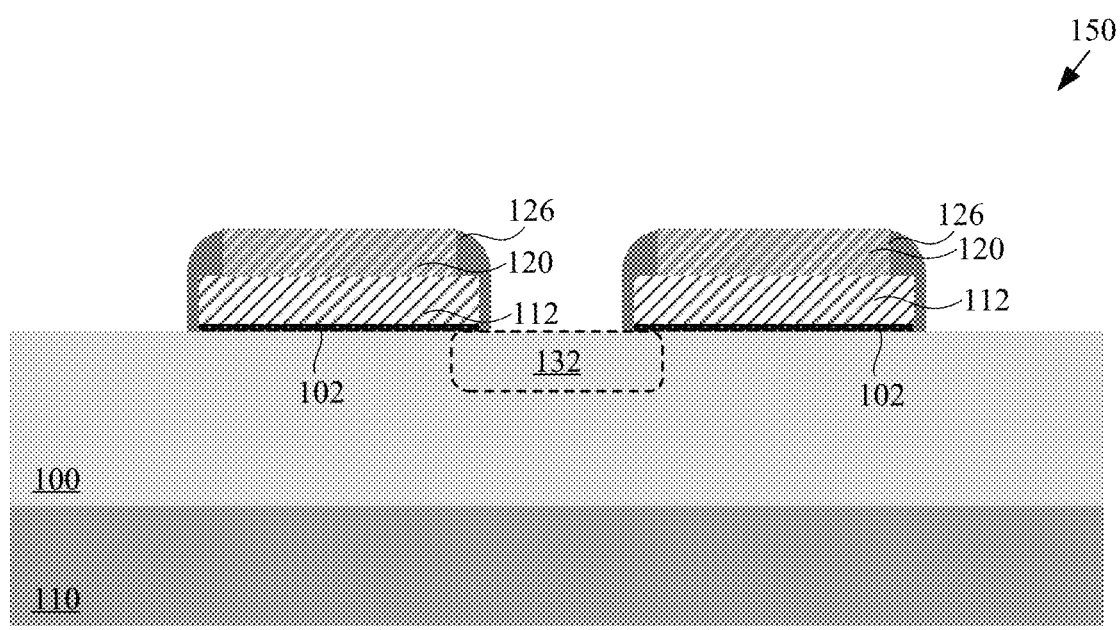
FIG. 4 is a cross-section view of a partially completed flash memory device array after dielectric spacer formation on sidewalls of floating gate stacks and formation of a source region, according to an embodiment of the disclosure.

FIG. 4 is a cross-section view of a partially completed flash memory device array 150 after dielectric spacer formation 126 on sidewalls of the floating gate stacks and formation of a source region 132 in the substrate 110, according to an embodiment of the disclosure. Referring to FIG. 4, dielectric spacers 126 may be formed on sidewalls of the floating gate stacks by depositing a layer of silicon dioxide over the floating gate stacks and anisotropically etching the silicon dioxide layer. Subsequently, the source region 132 may be formed by implanting dopants into the substrate 110 between the floating gate stacks followed by an activation anneal. The dopants may include phosphorus ($Ph^+$) or arsenic ($As^+$). The dielectric spacers 126 may subsequently be removed from sidewalls of the floating gate stacks after the formation of the source region 132.

Figure 5:
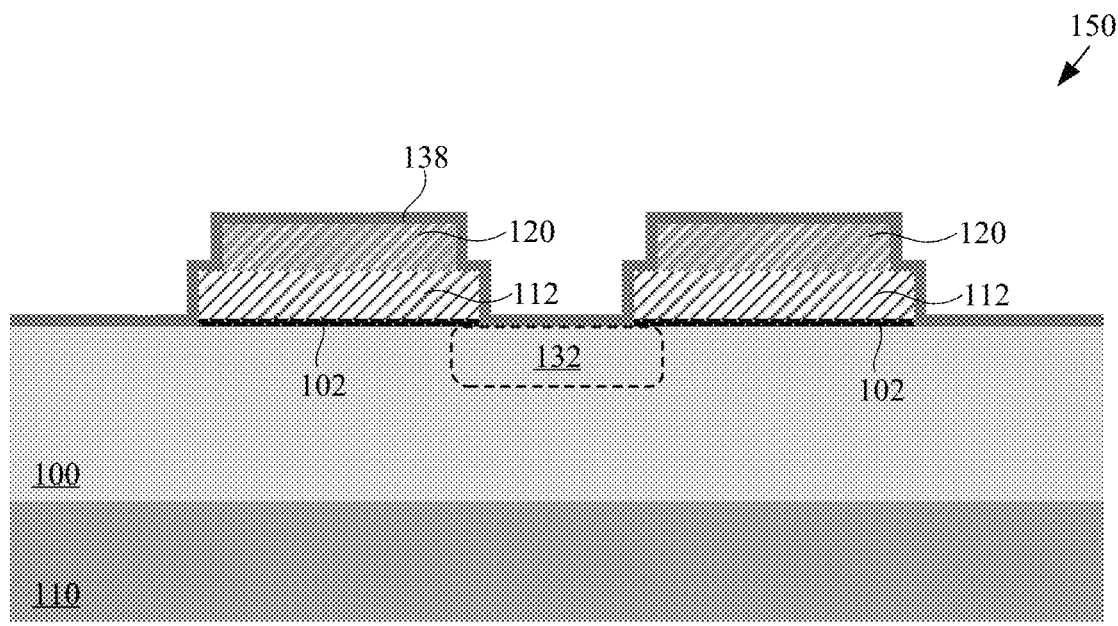
FIG. 5 is a cross-section view of a partially completed flash memory device array after removal of the dielectric spacers from the sidewalls of the floating gate stacks and deposition of a dielectric layer over a substrate, the floating gate stacks and the source region, according to an embodiment of the disclosure.

FIG. 5 is a cross-section view of a partially completed flash memory device array 150 after removal of the dielectric spacers 126 from sidewalls of the floating gate stacks and deposition of a dielectric layer 138 over the substrate 110, the floating gate stacks and the source region 132, according to an embodiment of the disclosure. Prior to the deposition of the dielectric layer 138, one or more cleaning steps such as SC1, using ammonia hydroxide, hydrogen peroxide and water mixture, may be performed. In an embodiment, the dielectric layer 138 may be made of silicon dioxide. The thickness of the dielectric layer 138 ranges between 100 Å and 150 Å, with a preferred thickness range between 110 Å and 120 Å. The dielectric layer 138 may be deposited by CVD, ALD, PVD or any other suitable deposition methods.

Figure 6:
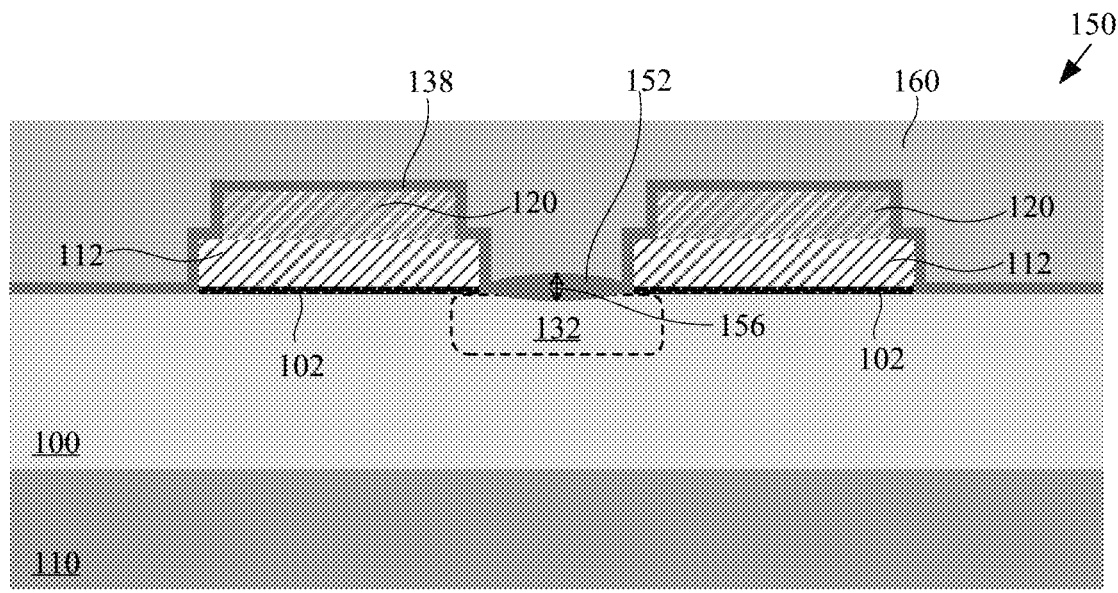
FIG. 6 is a cross-section view of a partially completed flash memory device array after formation of a gate dielectric portion over the source region and deposition of a polysilicon layer over the substrate, floating gate stacks and the source region, according to an embodiment of the disclosure.

FIG. 6 is a cross-section view of a partially completed flash memory device array 150 after formation of a gate dielectric portion 152 over the source region 132 and deposition of a polysilicon layer 160 over the dielectric layer 138, according to an embodiment of the disclosure. The thickness 156 of the gate dielectric portion 152 ranges between 150 Å and 350 Å, with a preferred thickness range between 250 Å and 300 Å. The gate dielectric portion 152 may be thermally grown. The source region 132 may be highly doped relative to the doped well region 100 and the substrate 110, thus resulting in the formation of a thicker gate dielectric portion 152 as the oxidation rate is increased. In an embodiment, the gate dielectric portion 152 may be made of silicon dioxide. The polysilicon layer 160 may be a doped polysilicon layer or polycide, and it may be deposited to a thickness on the order of 800 Å to 1500 Å. The polysilicon layer 160 may be deposited by CVD, ALD, PVD or any other suitable deposition methods.

Figure 7:
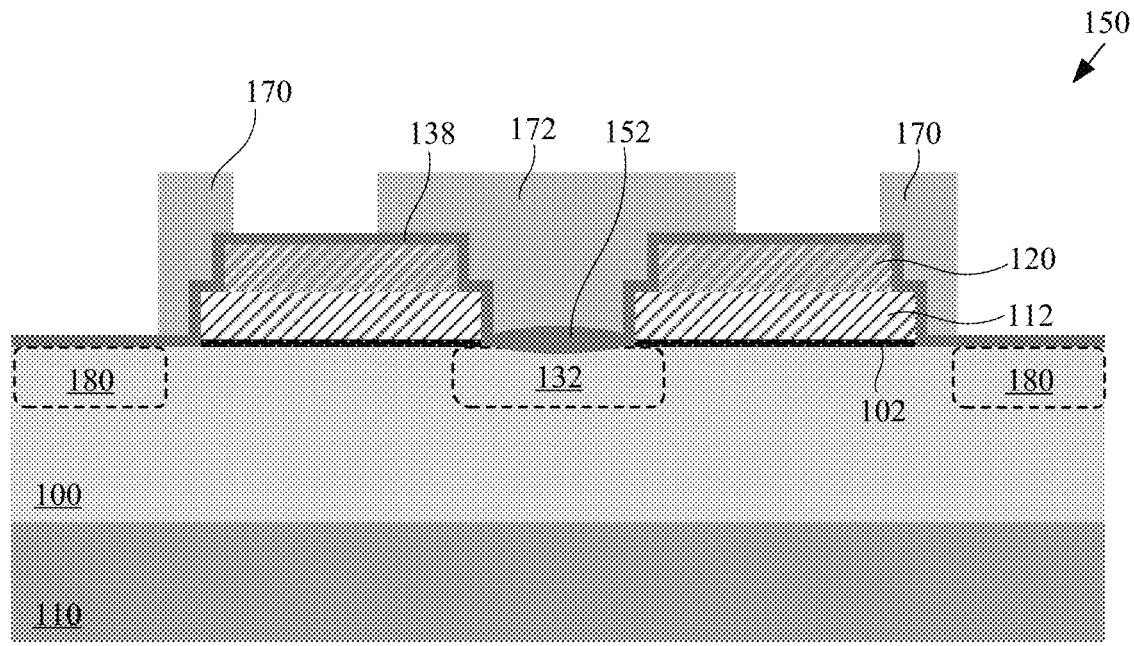
FIG. 7 is a cross-section view of a partially completed flash memory device array after formation of an erase/control gate over the source region and between the floating gate stacks and select gates on opposite sides of the floating gate stacks from the erase/control gate, according to an embodiment of the disclosure.

FIG. 7 is a cross-section view of a partially completed flash memory device array 150 after formation of an erase/control gate 172 over the source region 132 and between the floating gate stacks. Select gates 170 are formed on opposite sides of the floating gate stacks from the erase/control gate 172, according to an embodiment of the disclosure. The erase/control gate may have an upper portion and a lower portion. The upper portion of the erase/control gate 172 may overlap the floating gate stacks by an amount in the range of 100 Å to 400 Å. The overlap amount between the erase/control gate 172 and the floating gate stacks may be tuned to adjust the "coupling ratio". The term "coupling ratio" is used to indicate the voltage transfer capability from the erase/control gate to the floating gate stack. A higher "coupling ratio" may lead to lower programming but higher erasing voltages as there is a trade-off between program and erase when the overlap varies. The optimization of the overlap amount is needed to achieve the desired performance. The lower portion of the erase/control gate 172 is adjacent to the floating gate stacks. The gate dielectric portion 152 may separate the erase/control gate 172 from the source region 132. The dielectric layer 138 may separate the floating gate stacks from the erase/control gate 172 and the select gates 170. The dielectric caps 120 positioned above the floating gates 112 may separate the floating gates 112 from the upper portion of the erase/control gate 172.

The erase/control gate 172 and the select gates 170 may be fabricated simultaneously by patterning the deposited polysilicon layer 160 in a photolithographic step. Although not shown, patterning of the polysilicon layer 160 may include depositing a layer of photoresist material on the polysilicon layer 160 followed by conventional photoresist exposure and developing to form photoresist patterns that are consistent with prior art practices. A wet etch or dry etch process may be used to remove portions of the polysilicon layer 160 that are not covered by the photoresist patterns. Although not shown, the photoresist material may be removed after the etching processes. Drain regions 180 may then be formed in the substrate 110, adjacent to the select gates 170. The formation of the drain regions 180 may include implanting dopants such as $Ph^+$ or $As^+$ into the substrate 110 followed by activation annealing.

Figure 8:
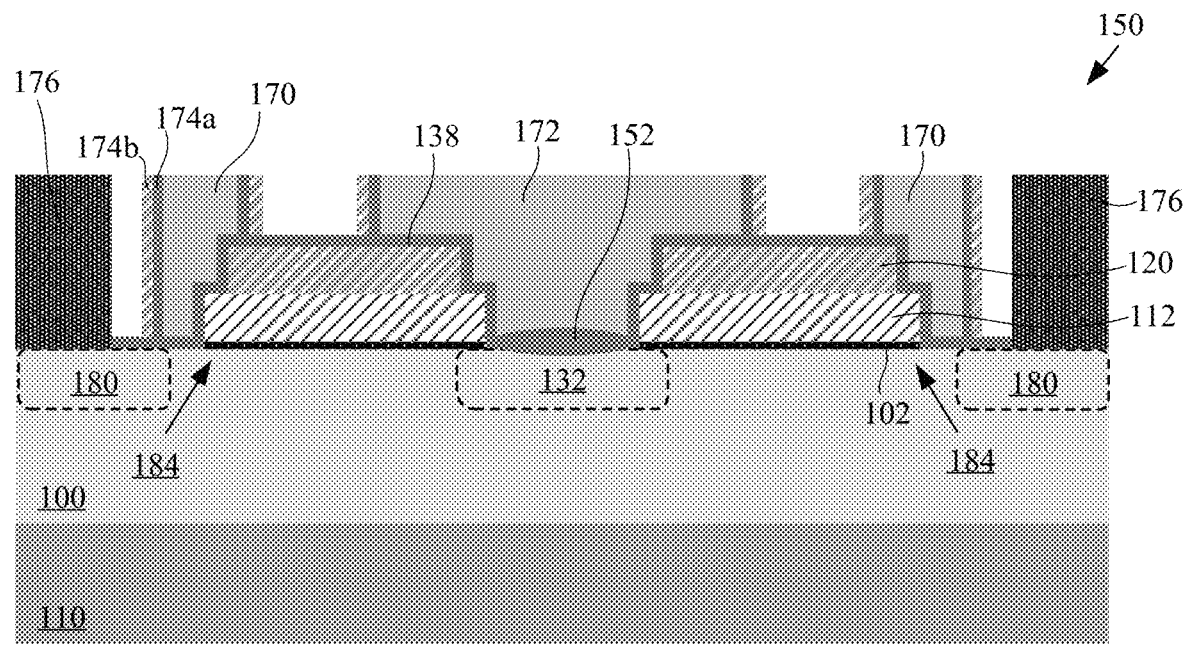
FIG. 8 is a cross-section view of a flash memory device array after formation of dielectric spacers on sidewalls of the erase/control gate and select gates and formation of bit line contacts, according to an embodiment of the disclosure.

FIG. 8 is a cross-section view of a flash memory device array 150 after formation of dielectric spacers 174a and 174b on sidewalls of the erase/control gate 172 and select gates 170 and formation of bit line contacts 176, according to an embodiment of the disclosure. The formation of the dielectric spacers 174a and 174b may include depositing a first layer of dielectric material over the erase/control gate 172 and the select gates 170 followed by anisotropic etching of the deposited dielectric layer. A second layer of dielectric material may subsequently be deposited over the first layer of dielectric material followed by anisotropic etching of the second layer of dielectric material. The dielectric spacers 174a and 174b may be made of silicon dioxide or silicon nitride. The thicknesses of the dielectric spacers 174a and 174b range between 100 Å and 500 Å.

Although not shown, a layer of interlayer dielectric (ILD) material may subsequently be deposited over the flash memory device array 150 followed by planarization to remove the ILD material from upper surfaces of the erase/control gate 172 and the select gates 170. In an embodiment, the ILD material may be made of silicon dioxide, silicon oxynitride, borosilicate glass (BSG), phosphoric silicate glass (PSG), fluorinated silicate glass (FSG), low-k material, another suitable material or a combination thereof. In some embodiments, the ILD material includes multiple sub-layers.

The ILD material may subsequently be patterned to expose portions of the drain regions 180. In an embodiment, portions of the dielectric layer 138 over the drain regions 180 may also be removed. Bit line contacts 176 may subsequently be formed over the exposed drain regions 180. The formation of bit line contacts 176 may include depositing a layer of conductive material over the drain regions 180 and over the ILD material. A planarization process, such as chemical mechanical planarization (CMP), may be used to remove portions of the conductive material from upper surfaces of the ILD material. In an embodiment, the conductive material may be tungsten (W). Although not shown, contacts for the source region 132 may subsequently be formed.

An exemplary set of biasing conditions for an embodiment of the flash memory device array 150 is listed in Table 1 below. During an erase operation, electrons are forced to tunnel from the floating gates 112 to the erase/control gate 172. When the electric field across the dielectric layer 138 between the floating gate 112 and the erase/control gate 172 is more than 10 MV/cm, Fowler-Nordheim tunneling becomes significant, and electrons with sufficient energy can tunnel from the cathode electrode (floating gate) to the anode electrode (erase/control gate).

In the erase mode, as illustrated in Table 1, the erase/control gate 172 of a selected flash memory device array is biased to 12 volts while the source region 132, the select gate 170 and the drain region 180 are grounded. The floating gates 112 adjacent to the erase/control gate 172 in a selected flash memory device array 150 are erased simultaneously. As the floating gates become more positively charged, the threshold voltage of the memory devices decreases.

In an unselected flash memory device array 150, the erase/control gate 172, the source region 132, the select gate 170 and the drain 180 are grounded. With these conditions, the electric field between the floating gate 112 and the erase/control gate 172 is not strong enough to induce Fowler-Nordheim tunneling.

During a programming operation, the erase/control gate 172 of a selected flash memory device is biased to 4.5V, the source region 132 is biased between 5 to 8V, the select gate 170 is biased between 1 to 1.5V and a current with a value between 1 to 3 µA is forced through the drain region 180. The current is provided by a current source. These biasing conditions produce a strong, vertically oriented electric field in a channel region 184 between the select gate 170 and the floating gate 112, with electrons being delivered to edge portions of the floating gates 112 by hot electron injection from the channel region. This is sometimes referred to as source-side injection.

In an unselected flash memory device, the erase/control gate 172, the source region 132 and the select gate 170 are grounded. The drain region 180 is biased between 0 to 2.5V. With these conditions, the electric field in the channel region 184 is not strong enough to produce hot electrons.

During a reading operation, the erase/control gate 172 of a selected flash memory device is biased between 1 to 2.5V, the select gate 170 is biased between 1 to 2.5V and the drain region 180 is biased to 0.9V. A current may be detected through the bit line contact 176 depending on the threshold voltage of the selected flash memory device. In an unselected flash memory device, the erase/control gate 172, the select gate 170 and the drain region 180 are grounded. Hence, no current flows through the bit line contact 176 of an unselected flash memory device.

TABLE 1

| Operating mode | Source Select | Source Unselect | Select Gate Select | Select Gate Unselect | Drain Select | Drain Unselect | Erase/Control Gate Select | Erase/Control Gate Unselect |
|---|---|---|---|---|---|---|---|---|
| Program | 5 to 8 V | 0 V | 1 to 1.5 V | 0 V | 1 to 3 µA | 0 to 2.5 V | 4.5 V | 0 V |
| Erase | 0 V | 0 V | 0 V | 0 V | 0 V | 0 V | 12 V | 0 V |
| Read | 0 V | 0 V | 1 to 2.5 V | 0 V | 0.9 V | 0 V | 1 to 2.5 V | 0 V |

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:

1. A memory device comprising:
a substrate;
a source region in the substrate;
a first gate stack comprising a floating gate positioned above the substrate and adjacent to the source region;
a dual function gate structure having an upper portion and a lower portion positioned above the source region, wherein the upper portion overlaps the first gate stack and the lower portion is adjacent to the first gate stack;
a second gate positioned above the substrate on an opposite side of the first gate stack from the dual function gate;
a dielectric cap positioned above the floating gate and separating the floating gate from the dual function gate; and
a drain region in the substrate adjacent to the second gate.

2. The memory device of claim 1, wherein the upper portion of the dual function gate partially overlaps the dielectric cap.

3. The memory device of claim 1, wherein the dual function gate acts as a control gate and an erase gate.

4. The memory device of claim 1, wherein the second gate is a select gate that is a section of a word line.

5. The memory device of claim 1, wherein the first gate stack further comprises a gate dielectric layer that separates the floating gate from the substrate and has a thickness in a range between 80 Å to 100 Å.

6. The memory device of claim 5, wherein the gate dielectric layer is made of silicon dioxide.

7. The memory device of claim 1 further comprising a dielectric layer positioned over the first gate stack to separate the first gate stack from the dual function gate and the second gate.

8. The memory device of claim 7 wherein the dielectric layer is made of silicon dioxide.

9. The memory device of claim 1 further comprising a bit line contact over the drain region.

10. The memory device of claim 1, wherein the dual function gate is made of a layer of polysilicon.

11. A memory device array comprising:
a substrate;
a source region in the substrate;
floating gate stacks positioned above the substrate and adjacent to opposite sides of the source region, wherein each of the floating gate stacks comprises a floating gate;
an erase/control gate having an upper portion and a lower portion positioned above the source region, wherein the upper portion overlaps the floating gate stacks and the lower portion is adjacent to the floating gate stacks;
select gates positioned above the substrate on opposite sides of the floating gate stacks from the erase/control gate;
drain regions in the substrate adjacent to the select gates; and
a dielectric cap above each of the floating gates, separating each of the floating gates from the erase/control gate.

12. The memory device array of claim 11 wherein the upper portion of the erase/control gate at least partially overlaps the dielectric caps.

13. The memory device array of claim 11, further comprises a gate dielectric portion that separates the erase/control gate from the source region and has a thickness in a range between 150 Å to 350 Å.

14. A method of fabricating a memory device array comprising:
providing a substrate;
forming floating gate stacks above the substrate, wherein the formation of the floating gate stacks further comprises depositing a tunnel oxide layer over the substrate, depositing a floating gate layer over the tunnel oxide layer, and forming a dielectric cap over the floating gate layer;
forming a source region between the floating gate stacks;
forming a dual function gate having an upper portion and a lower portion positioned above the source region, wherein the upper portion overlaps the floating gate stacks and the lower portion is adjacent to the floating gate stacks;
forming select gates on opposite sides of the floating gate stacks from the dual function gate; and
forming drain regions adjacent to the select gates.

15. The method of claim 14, wherein the forming the floating gate stacks further comprises:
forming dielectric spacers on sidewalls of the dielectric cap;
patterning the tunnel oxide layer and the floating gate layer using the dielectric cap with dielectric spacers as a mask layer; and
removing the dielectric spacers from sidewalls of the dielectric cap.

16. The method of claim 14, wherein the forming the source region further comprises:
forming dielectric spacers on sidewalls of the floating gate stacks;
forming a doped region in the substrate between the floating gate stacks; and
removing the dielectric spacers from the sidewalls of the floating gate stacks after the formation of the source region.

17. The method of claim 16, wherein after the removing the dielectric spacers, further comprising:
depositing a dielectric layer over the substrate, the floating gate stacks and the source region, wherein a gate dielectric portion is formed over the source region prior to the formation of the dual function gate.

18. The method of claim 17, further comprising performing a process to thicken the gate dielectric portion over the source region.

19. The method of claim 17, wherein the formation of the dual function gate and the select gates further comprises:
depositing a layer of polysilicon over the dielectric layer; and
patterning the layer of polysilicon to simultaneously form the dual function gate and the select gates.

20. The method of claim 14 further comprising forming bit line contacts over the drain regions.

* * * * *